(12) United States Patent
Honda

(10) Patent No.: US 8,693,234 B2
(45) Date of Patent: Apr. 8, 2014

(54) MEMORY UNIT AND METHOD OF OPERATING THE SAME

(75) Inventor: Motonari Honda, Kanagawa (JP)

(73) Assignee: Sony Corporation, Tokyo (JP)

( * ) Notice: Subject to any disclaimer, the term of this patent is extended or adjusted under 35 U.S.C. 154(b) by 141 days.

(21) Appl. No.: 13/363,988

(22) Filed: Feb. 1, 2012

(65) Prior Publication Data
US 2012/0201069 A1    Aug. 9, 2012

(30) Foreign Application Priority Data
Feb. 8, 2011   (JP) .................................. 2011-024575

(51) Int. Cl.
*G11C 11/00* (2006.01)
(52) U.S. Cl.
USPC .......................................................... 365/148
(58) Field of Classification Search
USPC .......................................................... 365/148
See application file for complete search history.

(56) References Cited

U.S. PATENT DOCUMENTS

| | | | |
|---|---|---|---|
| 2009/0290411 A1* | 11/2009 | Xi et al. ........................ | 365/163 |
| 2011/0044092 A1* | 2/2011 | Ono et al. ..................... | 365/148 |
| 2012/0069633 A1* | 3/2012 | Katoh ........................... | 365/148 |
| 2012/0120711 A1* | 5/2012 | Rabkin et al. ................ | 365/148 |
| 2012/0320657 A1* | 12/2012 | Chung ........................... | 365/96 |

OTHER PUBLICATIONS

K. Aratani et al.; A Novel Resistance Memory with High Scalability and Nanosecond Switching; Technical Digest; IEDM 2007; pp. 783-786.

* cited by examiner

*Primary Examiner* — Hoai V Ho
*Assistant Examiner* — Min Huang
(74) *Attorney, Agent, or Firm* — Dentons US LLP

(57) ABSTRACT

A memory unit includes memory elements and a drive section. In executing a first operation out of the first operation for changing resistance state of the memory element from one resistance state out of low resistance state and high resistance state to the other resistance state and a second operation for changing the resistance state of the memory element from the other resistance state to the one resistance state, the drive section performs stepwise operation, in which the drive section repeatedly performs, at least one time, a step in which strong stress application step for applying a stress for performing the first operation to the memory element as the drive target relatively strongly is performed and subsequently weak stress application step for applying a stress for performing the second operation to the memory element as the drive target relatively weakly is performed, and subsequently performs the strong stress application step.

6 Claims, 16 Drawing Sheets

SETTING OPERATION

RESETTING OPERATION

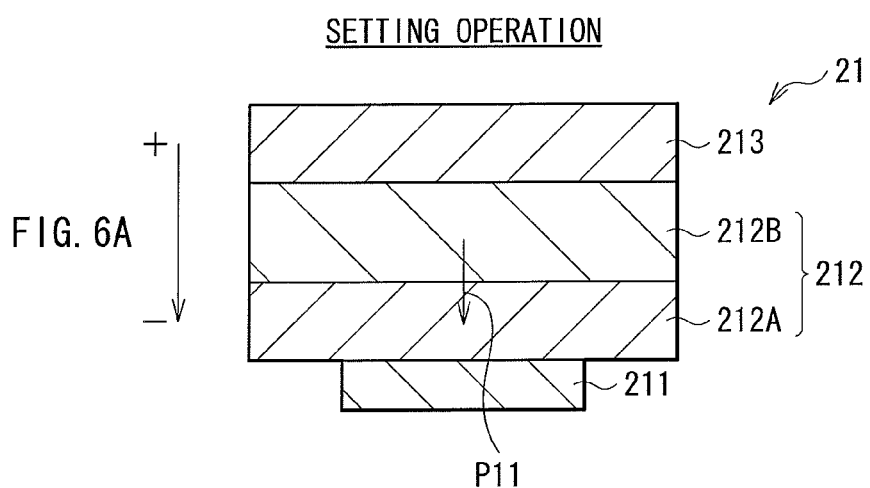
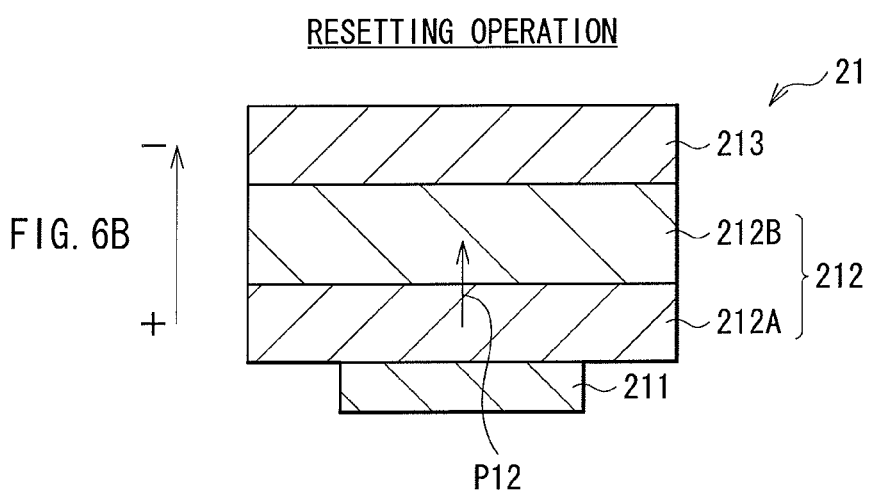

SETTING OPERATION (COMPARATIVE EXAMPLE)

FIG. 8A  BL1 ——————————— 0V

FIG. 8B  BL2 ——— $V_{set}$ ⎍ ——— 0V

FIG. 8C  WL ——— $V_{g\_set1}$ ∏∏∏....∏ ——— 0V

→ TIME

RESETTING OPERATION (COMPARATIVE EXAMPLE)

FIG. 9A  BL1 ——— $V_{g\_reset1}$ ∏∏∏....∏ ——— 0V

FIG. 9B  BL2 ——————————— 0V

FIG. 9C  WL ——— $V_{g\_reset}$ ⎍ ——— 0V

→ TIME

MEMORY UNIT AND METHOD OF OPERATING THE SAME

BACKGROUND

The present disclosure relates to a memory unit that includes memory elements storing information by change of electric characteristics of a memory layer and a method of operating the memory unit.

In information apparatuses such as a computer, a DRAM (Dynamic Random Access Memory) with a high-speed operation and high density is widely used as a random access memory. However, in the DRAM, the manufacturing cost is high since the manufacturing process is more complicated than that of a general logical circuit LSI (Large Scale Integrated Circuit) and a general signal processor used for electronic apparatuses. Further, since the DRAM is a volatile memory in which information is not retained if the power is turned off, it is necessary to perform refresh operation frequently, that is, it is necessary to read out written information (data), amplify the information again, and rewrite the information.

Meanwhile, in recent years, what we call bipolar type resistance random access memories that record low resistance state and high resistance state according to current direction have been developed. Further, what we call 1T1R type (including one memory element for one transistor) nonvolatile memory cells composed of combination of such a bipolar type resistance random access memory and a selection transistor have been proposed as well. For example, in "A Novel Resistance Memory with High Scalability and Nanosecond Switching" (Technical Digest IEDM2007, pp. 783-786) by K. Aratani and more 12 authors, a new type resistance random access memory particularly advantageous to microfabrication limit of memory elements is proposed.

SUMMARY

The resistance random access memory of "A Novel Resistance Memory with High Scalability and Nanosecond Switching" mentioned above has a structure in which an ion conductor (memory layer) containing a metal is sandwiched between two electrodes. In the resistance random access memory, the metal contained in the ion conductor is contained in one of the two electrodes. Thereby, in the case where a voltage is applied between the two electrodes, the metal contained in the electrode is diffused as ions in the ion conductor, and a resistance value of the ion conductor or electric characteristics of a capacitance or the like are changed. In general, operation to change resistance state of a memory element from high resistance state to low resistance state is called "setting operation," while, by contrast, operation to change the resistance state thereof from low resistance state to high resistance state is called "resetting operation."

In the foregoing bipolar type resistance random access memories, it is important to upgrade retention characteristics of data (information) in order to improve long-term reliability. Examples of the retention characteristics of data include retention characteristics at the time of the foregoing setting operation and at the time of the foregoing resetting operation. However, in the existing methods of the setting operation and the resetting operation, it is difficult to appropriately adjust strength balance between stress application steps for performing the setting operation and the resetting operation, and it is also difficult to upgrade data retention characteristics. The foregoing "stress application step" herein means a step of applying a current, a voltage or the like for performing the setting operation or the resetting operation to a memory element as a drive target. Accordingly, proposals of methods capable of upgrading data retention characteristics and improving long-term reliability in memory elements have been aspired.

In view of the foregoing disadvantage, in the present disclosure, it is desirable to provide a memory unit capable of improving long-term reliability and a method of operating the same.

According to an embodiment of the present disclosure, there is provided a memory unit including a plurality of memory elements in which resistance state thereof is reversibly changed according to polarity of an applied voltage and a drive section that selectively changes resistance state of a memory element as a drive target from/to low resistance state to/from high resistance state. In executing a first operation out of the first operation for changing the resistance state of the memory element from one resistance state out of the low resistance state and the high resistance state to the other resistance state and a second operation for changing the resistance state of the memory element from the other resistance state to the one resistance state, the drive section performs stepwise operation, in which the drive section repeatedly performs, at least one time a step in which strong stress application step for applying a stress for performing the first operation to the memory element as the drive target relatively strongly is performed and subsequently weak stress application step for applying a stress for performing the second operation to the memory element as the drive target relatively weakly is performed, and subsequently performs the strong stress application step. The foregoing "applying a stress" herein means applying a current, a voltage or the like for performing the first operation or the second operation to the memory element as the drive target.

According to an embodiment of the present disclosure, there is provided a method of operating a memory unit, wherein in a memory unit including a plurality of memory elements in which resistance state is reversibly changed from/to low resistance state to/from high resistance state according to polarity of an applied voltage, a method of executing a first operation out of the first operation for changing resistance state of a memory element from one resistance state out of the low resistance state and the high resistance state to the other resistance state and a second operation for changing the resistance state of a memory element from the other resistance state to the one resistance state includes a first step of performing a strong stress application step for applying a stress for performing the first operation to a memory element as a drive target relatively strongly and subsequently performing a weak stress application step for applying a stress for performing the second operation to the memory element as the drive target relatively weakly, and a second step of repeatedly performing, at least one time, the first step, and subsequently performing the strong stress application step (performing the foregoing stepwise operation).

In the memory unit and the method of operating a memory unit of the embodiments of the present disclosure, in executing the first operation for changing the resistance state of the memory element from the one resistance state to the other resistance state, the drive section performs the stepwise operation, in which the drive section repeatedly performs, at least one time, a step in which the strong stress application step for applying the stress for performing the first operation to the memory element as the drive target relatively strongly is performed and subsequently the weak stress application step for applying the stress for performing the second operation to the memory element as the drive target relatively weakly is performed (the first step), and subsequently performs the strong stress application step (the second step). Specifically, by performing the strong stress application step of the first operation after performing the weak stress application step of the second operation advantageous to performing the target first operation, the target first operation as the entire stepwise operation is executed. Accordingly, operation strength balance between the stress application step of the first operation and the stress application step of the second operation is appropriately adjusted. In result, data retention characteristics at the time of the target first operation are upgraded.

It is a definition issue whether writing operation/erasing operation for the memory element corresponds to decreasing resistance (change from high resistance state to low resistance state) or increasing resistance (change from low resistance state to high resistance state). In this specification, low resistance state is defined as writing state, and high resistance state is defined as erasing state.

According to the memory unit and the method of operating a memory unit of the embodiments of the present disclosure, in executing the first operation, the drive section performs the stepwise operation, in which the drive section repeatedly performs at least one time, a step in which the strong stress application step is performed and subsequently the weak stress application step is performed, and subsequently performs the strong stress application step. Therefore, data retention characteristics at the time of the target first operation are able to be upgraded, and long-term reliability is able to be improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

FIGS. 6A and 6B are cross sectional views for explaining summary of the general setting operation and the general resetting operation.

FIGS. 8A to 8C are timing waveform charts illustrating setting operation according to a comparative example.

FIGS. 9A to 9C are timing waveform charts illustrating resetting operation according to the comparative example.

DETAILED DESCRIPTION OF THE PREFERRED EMBODIMENT

An embodiment of the present disclosure will be hereinafter described in detail with reference to the drawings. The description will be given in the following order.
1. Embodiment (an example in which stepwise operation is performed both in setting operation and resetting operation)
2. Modifications
Modification 1 (an example in which operation modes of setting operation and resetting operation are switched)
Modifications 2 and 3 (Other configuration examples of memory elements)
Other modifications
<Embodiment>
[Configuration of Memory Unit 1]

Figure 1:
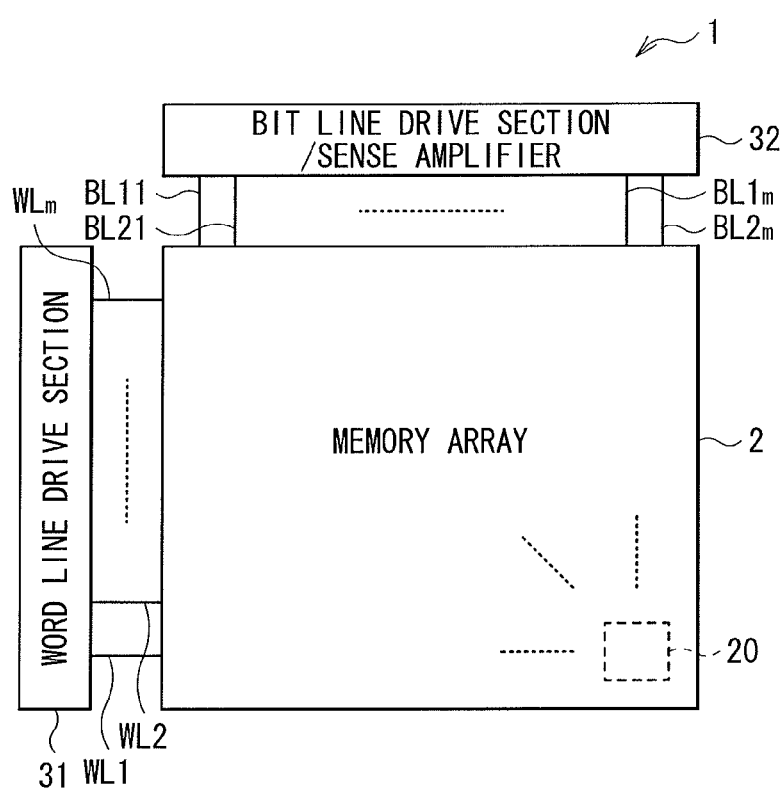
FIG. 1 is a block diagram illustrating a configuration example of a memory unit according to an embodiment of the present disclosure.

FIG. 1 illustrates a block configuration of a memory unit (memory unit 1) according to an embodiment of the present disclosure. The memory unit 1 includes a memory array 2 having a plurality of memory cells 20, a word line drive section 31, and a bit line drive section/sense amplifier 32. Of the foregoing elements, the word line drive section 31 and the bit line drive section/sense amplifier 32 correspond to a specific example of a "drive section" in the present disclosure.

The word line drive section 31 applies a given electric potential (after-mentioned word line electric potential) to a plurality of (in this case, m pieces (m: an integer number equal to or greater than 2)) word lines WL1 to WLm arranged in parallel with each other (side by side) in the row direction.

The bit line drive section/sense amplifier 32 respectively applies a given electric potential to a plurality of (in this case, m pieces) bit lines BL11 to BL1m and a plurality of (in this case, m pieces) bit lines BL21 to BL2m arranged in parallel with each other (side by side) in the column direction. Thereby, a given voltage (a voltage corresponding to stress application at the time of performing setting operation or resetting operation described later) is respectively applied between the bit lines BL11 and BL21, between the bit lines BL12 and BL22 . . . and between the bit lines BL1m and BL2m. Further, the bit line drive section/sense amplifier 32 has a function to perform readout operation of information (data) from the respective memory cells 20 by using the foregoing m pieces of bit lines BL11 to BL1m and the foregoing m pieces of bit lines BL21 to BL2m, and a function to perform given signal amplification process in the internal sense amplifier. In the following description, the bit line BL1 is used as a collective term of the bit lines BL11 to BL1m and the bit line BL2 is used as a collective term of the bit lines BL21 to BL2m as appropriate.

As described above, the word line drive section 31 and the bit line drive section/sense amplifier 32 select one memory cell 20 as a drive target (operation target) from the plurality of memory cells 20 in the memory array 2, and selectively perform writing operation, erasing operation, or readout operation of information.

[Configuration of Memory Array 2]

Figure 2:
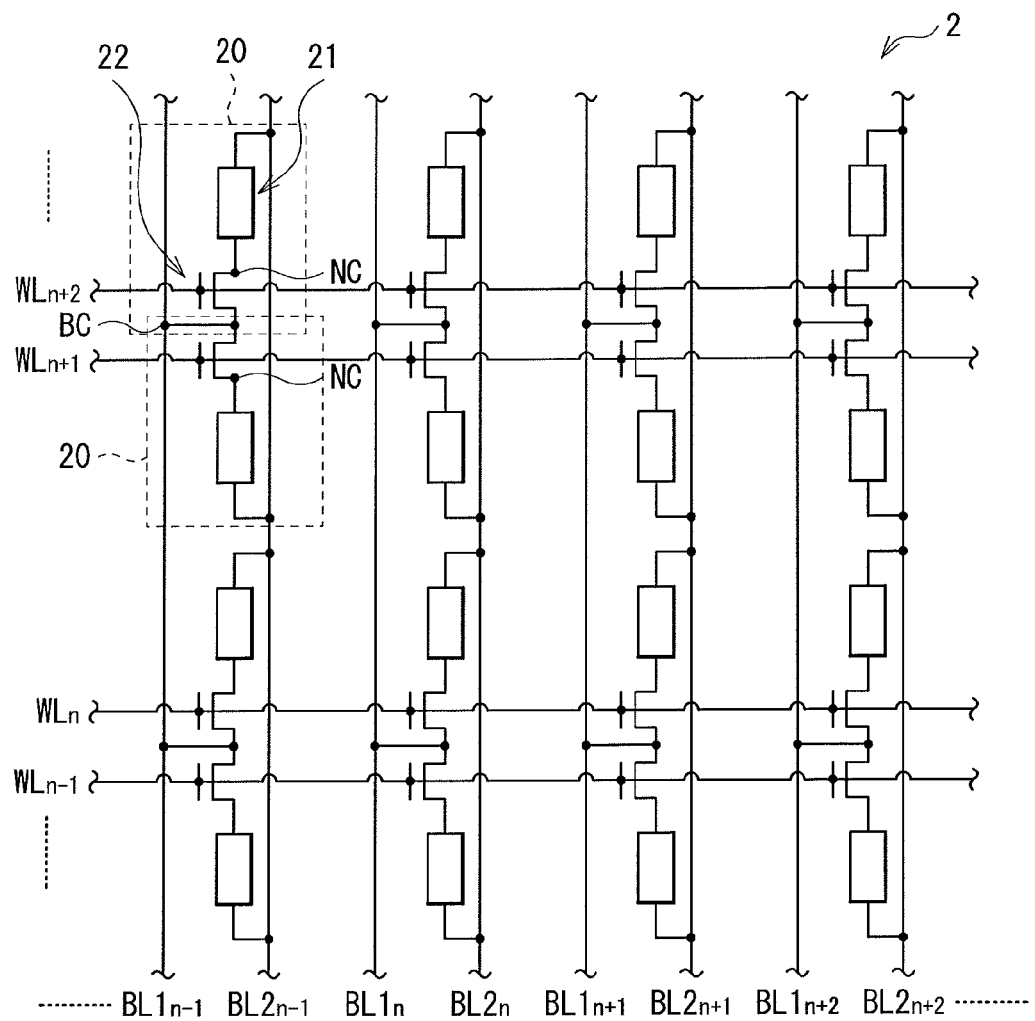
FIG. 2 is a circuit diagram illustrating a configuration example of a memory array illustrated in FIG. 1.

In the memory array 2, as illustrated in FIG. 1, the plurality of memory cells 20 are arranged in a row-column state (matrix state). FIG. 2 illustrates a circuit configuration example of the memory array 2. In the memory array 2, one word line WL and a pair of bit lines BL1 and BL2 are connected to the respective memory cells 20.

Figure 3:
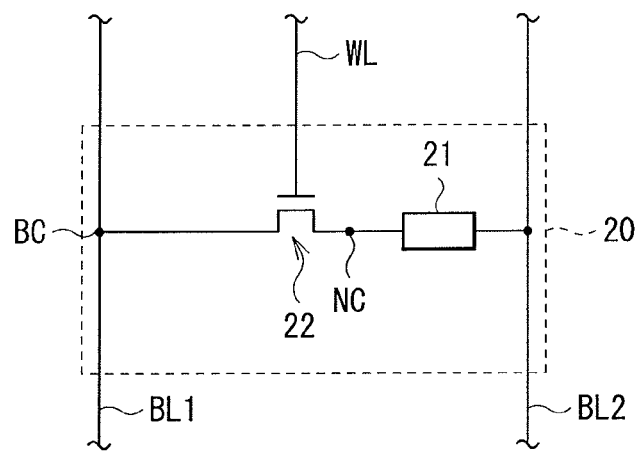
FIG. 3 is a circuit diagram illustrating a configuration example of a memory cell illustrated in FIG. 2.

Further, as illustrated in FIG. 2 and FIG. 3, the respective memory cells 20 have one memory element 21 and one selection transistor 22, and have a so-called "1T1R" type circuit configuration (memory cell). In the memory cell 20, the word line WL is connected to a gate of the selection transistor 22, and the bit line BL1 is connected to one of a source and a drain in the selection transistor 22 through a bit contact BC. The bit line BL2 is connected to the other one (node contact NC side) of the source and the drain in the selection transistor 22 through the memory element 21. Further, as illustrated in FIG. 2, the bit contact BC is commoditized (commonly used) for the upper and the lower memory cells 20 along the bit line BL1 direction. Thereby, the area of the memory array 2 is saved. However, the configuration is not limited to the foregoing description, and the bit contact BC may be provided for every memory cell 20 separately.

The selection transistor 22 is a transistor for selecting one memory element 21 as a drive target, and is composed of, for example, an MOS (Metal Oxide Semiconductor) transistor. However, the selection transistor 22 is not limited thereto, and a transistor having other structure may be used.

[Memory Element 21]

Figure 4:
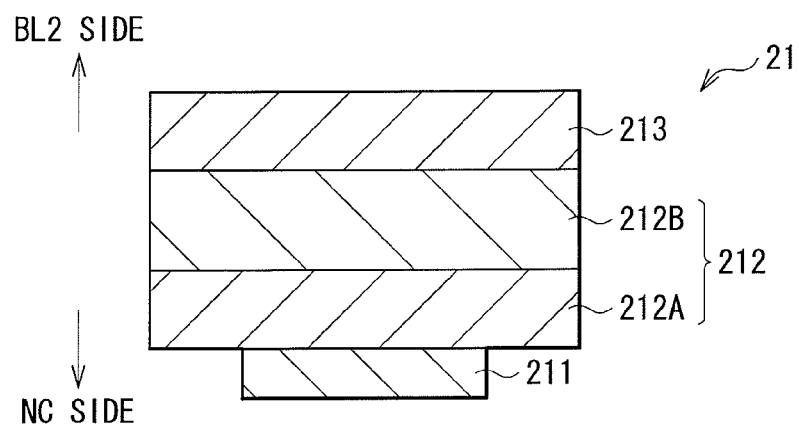
FIG. 4 is a cross sectional view illustrating a configuration example of a memory element illustrated in FIG. 2.

The memory element 21 is an element that performs storing (writing and erasing) of information (data) by using a fact that resistance state is reversibly changed (changed between low resistance state and high resistance state) according to polarity of an applied voltage. As illustrated in the cross sectional view of FIG. 4, the memory element 21 has a lower electrode 211 (first electrode), a memory layer 212, and an upper electrode 213 (second electrode) in this order.

The lower electrode 211 is an electrode provided on the selection transistor 22 side (node contact NC side). The lower electrode 211 is made of a wiring material used for semiconductor process such as W (tungsten), WN (tungsten nitride), titanium nitride (TiN), and tantalum nitride (TaN).

The memory layer 212 has a laminated structure having an ion source layer 212B provided on the upper electrode 213 side and a resistance change layer 212A provided on the lower electrode 211 side. Though described in detail later, in the memory layer 212, resistance state is reversibly changed (changed between low resistance state and high resistance state) according to polarity of a voltage applied between the lower electrode 211 and the upper electrode 213.

The ion source layer 212B contains at least one chalcogen element out of tellurium (Te), sulfur (S), and selenium (Se) as an ion conductive material becoming anions. Further, the ion source layer 212B contains zirconium (Zr) and/or copper (Cu) as a metal element capable of becoming cations, and further contains aluminum (Al) and/or germanium (Ge) as an element that forms an oxide at the time of erasing information. Specifically, the ion source layer 212B is made of an ion source layer material having composition such as ZrTeAl, ZrTeAlGe, CuZrTeAl, CuTeGe, and CuSiGe. The ion source layer 212B may contain an element other than the foregoing elements such as silicon (Si).

The resistance change layer 212A has a function to stabilize information retention characteristics as an electric conduction barrier, and is made of a material having a resistance value higher than that of the ion source layer 212B. Preferable examples of a material of the resistance change layer 212A include a rare earth element such as Gd (gadolinium) and an oxide or a nitride containing at least one of Al, Mg (magnesium), Ta, Si (silicon), and Cu.

The upper electrode 213 is made of a known semiconductor wiring material similar to that of the lower electrode 211. Specially, a stable material that does not react with the ion source layer 212B even after post annealing is preferable.

[Function and Effect of Memory Unit 1]

(1. Basic Operation)

In the memory unit 1, as illustrated in FIG. 1 and FIG. 2, the word line drive section 31 applies a given electric potential (after-mentioned word line electric potential) to the m pieces of word lines WL1 to WLm. In addition, the bit line drive section/sense amplifier 32 applies a given electric potential respectively to the m pieces of bit lines BL11 to BL1m and the m pieces of bit lines BL21 to BL2m. In other words, a given voltage (a voltage corresponding to stress application at the time of performing setting operation or resetting operation described later) is respectively applied between the bit lines BL11 and BL21, between the bit lines BL12 and BL22 . . . and between the bit lines BL1m and BL2m. Thereby, one memory cell 20 as a drive target (operation target) is selected from the plurality of memory cells 20 in the memory array 2, and writing operation, erasing operation, or readout operation of information is selectively performed.

Specifically, in the memory element 21 in the respective memory cells 20, resistance state of the memory layer 212 is reversibly changed (changed between low resistance state and high resistance state) according to polarity of a voltage applied between the lower electrode 211 and the upper electrode 213. By using such a fact, in the memory element 21, readout operation or erasing operation of information is performed.

Meanwhile, the bit line drive section/sense amplifier 32 performs readout operation of information from the memory element 21 in the memory cell 20 as the drive target (operation target) by using the m pieces of bit lines BL11 to BL1m and the m pieces of bit lines BL21 to BL2m, and performs given signal amplification process in the internal sense amplifier. Thereby, readout operation of information from the memory element 21 is performed.

In selecting the memory cell 20 (memory element 21) as the drive target (operation target), a given electric potential (word line electric potential) is applied to the word line WL connected to the memory cell 20, and the foregoing given voltage is applied between the connected bit lines BL1 and BL2. Meanwhile, in memory cells 20 other than the memory cell 20 as the drive target (operation target), a ground electric potential (for example, 0 V) is applied to the connected word line WL, and the connected bit lines BL1 and BL2 are respectively set to floating state or ground electric potential (0 V).

A description will be given of summary of general setting operation and general resetting operation corresponding to writing operation or erasing operation of information with reference to FIG. 5A to FIG. 6B. The setting operation is operation to change resistance state of the memory element 21 (specifically, the memory layer 212) from high resistance state (initial state) to low resistance state (operation to decrease resistance of the memory element 21). Further, by contrast, the resetting operation is operation to change resistance state of the memory element 21 (memory layer 212) from low resistance state to high resistance state (operation to increase resistance of the memory element 21). In this case, the setting operation and the resetting operation respectively mean an entire set of operations until a resistance value of the memory element 21 is changed to a desired value. In order to complete the foregoing operations (for example, to implement verification step (readout operation step for checking whether or not writing information or erasing information is normally performed at the time of setting operation or resetting operation)), stress application is performed on the memory element 21. The foregoing "stress application" herein means applying a current, a voltage or the like for performing setting operation or resetting operation to the memory element 21 as the drive target.

Figure 5A:
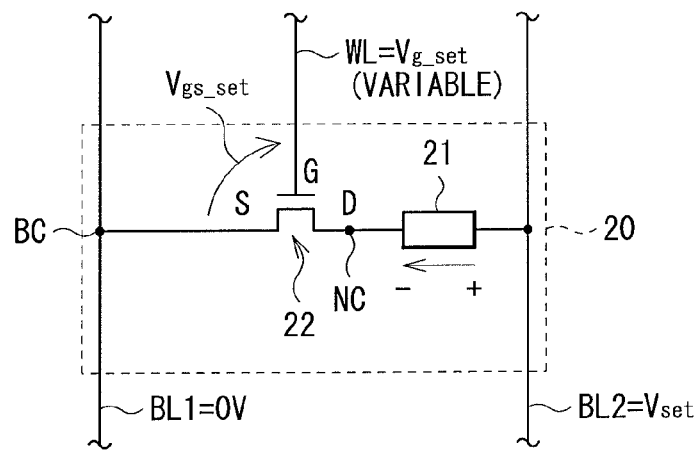
FIGS. 5A and 5B are circuit diagrams for explaining summary of general setting operation and general resetting operation.

Specifically, at the time of the general setting operation illustrated in FIG. 5A, in the memory cell 20 as the drive target, a given word line electric potential Vg_set is applied to the word line WL (gate of the selection transistor 22). In addition, a given setting voltage Vset is applied between the bit lines BL1 and BL2 by using the electric potential of the bit line BL1 (in this case, 0 V) on the low electric potential side out of the bit lines BL1 and BL2 (in this case, the source side of the selection transistor 22) as a reference. Subsequently, as illustrated in FIG. 5A and FIG. 6A, in the memory element 21 as the drive target, a negative electric potential is applied to the lower electrode 211 side, and a positive electric potential is applied to the upper electrode 213 side respectively (that is, a positive voltage is applied to the memory element 21). Thereby, in the memory layer 212, cations such as Cu and/or Zr are ion-conducted from the ion source layer 212B, are bonded with electrons on the lower electrode 211 side, and are precipitated. In result, a conductive path (filament) of low resistance Zr and/or Cu or the like that is reduced to metal state is formed in the interface between the lower electrode 211 and the resistance change layer 212A. Otherwise, a conductive path is formed in the resistance change layer 212A. Thus, a resistance value of the resistance change layer 212A is decreased (resistance is lowered), and high resistance state as initial state is changed to low resistance state. Accordingly, the setting operation is performed in the memory element 21 as the drive target. After that, even if the positive voltage is removed and the voltage applied to the memory element 21 is eliminated, the low resistance state is retained. Thereby, information is written in the memory element 21.

Relative strength of such setting operation (relative strength of stress application at the time of performing setting operation) is adjusted according to size of a voltage applied to the gate of the selection transistor 22 (the foregoing word line electric potential Vg_set). This is because, according to the magnitude of the word line electric potential Vg_set, a current flowing between the source and the drain of the selection transistor 22 (current flowing between the lower electrode 211 and the upper electrode 213 in the memory element 21) is changed, and the number and size of formed conductive paths (filament) are controlled. Specifically, in the case where the word line electric potential Vg_set is relatively high (large), stress application for performing setting operation is performed relatively strongly (strong setting stress application). Meanwhile, in the case where the word line electric potential Vg_set is relatively low (small), stress application for performing setting operation is performed relatively weakly (weak setting stress application). Accordingly, as illustrated in FIG. 5A, a value of the word line electric potential Vg_set is variable. The high and low (large and small) relation of the foregoing word line electric potential Vg_set is an example in the case that the selection transistor 22 is an N-type MOS transistor. In the case where a P-type MOS transistor is used, the high and low (large and small) relation of the word line electric potential Vg_set is inverted. In the following description, an example in which the selection transistor 22 is an N-type MOS transistor will be explained. Meanwhile, magnitude of the foregoing setting voltage Vset does not contribute to relative strength of stress application at the time of performing setting operation. Accordingly, for the relative strength of stress application at the time of performing setting operation, Expression 1 and Expression 2 described below are established.

$$Vg\_set \text{ (at the time of applying strong setting stress)} > Vg\_set \text{ (at the time of applying weak setting stress)} \quad\quad 1$$

$$Vset \text{ (at the time of applying strong setting stress)} = Vset \text{ (at the time of applying weak setting stress)} \quad\quad 2$$

Figure 5B:
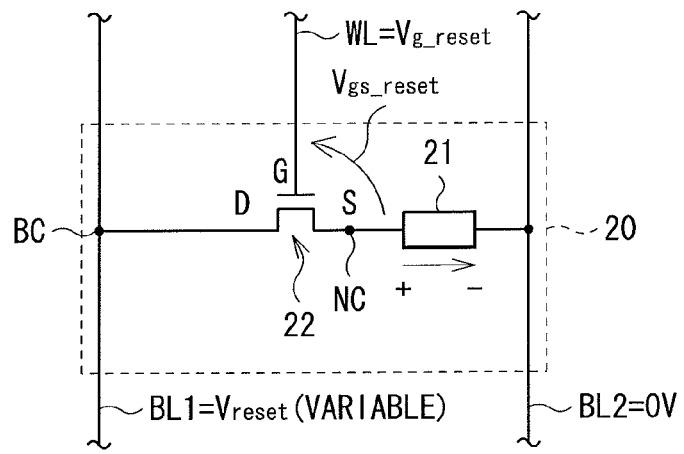

Meanwhile, at the time of the resetting operation illustrated in FIG. 5B, in the memory cell 20 as the drive target, a given word line electric potential Vg_reset is applied to the word line WL (gate of the selection transistor 22). In addition, a given resetting voltage Vreset is applied between the bit lines BL1 and BL2 by using the electric potential of the bit line BL2 (in this case, 0 V) on the low electric potential side out of the bit lines BL1 and BL2 (in this case, the source side of the selection transistor 22) as a reference. Subsequently, as illustrated in FIG. 5B and FIG. 6B, in the memory element 21 as the drive target, a positive electric potential is applied to the lower electrode 211 side, and a negative electric potential is applied to the upper electrode 213 side (that is, a negative voltage is applied to the memory element 21). Thereby, Zr and/or Cu of the conductive path formed in the resistance change layer 212 by the foregoing setting operation is oxidized and ionized, is dissolved in the ion source layer 212B or is bonded with Te or the like, and in result, a compound such as $Cu_2Te$ and CuTe is formed. Subsequently, the conductive path of Zr and/or Cu disappears or is decreased, and the resistance value is increased (resistance is increased). Alternatively, further, additive elements such as Al and Ge existing in the ion source layer 212B form an oxidized film on the anode, and resistance state is changed to high resistance. Accordingly, low resistance state is changed to high resistance state as initial state, and resetting operation is performed in the memory element 21 as the drive target. After that, even if the negative voltage is removed and the voltage applied to the memory element 21 is eliminated, the high resistance state is retained. Thereby, information written in the memory element 21 is able to be erased.

Relative strength of the foregoing resetting operation (relative strength of stress application at the time of performing resetting operation) is adjusted according to magnitude of a voltage applied between the source and the drain of the selection transistor 22 (the foregoing resetting voltage Vreset) after the conductive path (filament) disappears. This is because, according to the magnitude of the foregoing resetting voltage Vreset, a current flowing between the source and the drain of the selection transistor 22 (current flowing between the lower electrode 211 and the upper electrode 213 in the memory element 21) is changed, and disappearance degree of the conductive path (size of a disappeared region and the like) is controlled. Specifically, in the case where the resetting voltage Vreset is relatively high (large), stress application for performing resetting operation is performed relatively strongly (strong resetting stress application). Meanwhile, in the case where the resetting voltage Vreset is relatively low (small), stress application for performing resetting operation is performed relatively weakly (weak resetting stress application). Accordingly, as illustrated in FIG. 5B, a value of the resetting voltage Vreset is variable. Meanwhile, magnitude of the voltage applied to the gate of the selection transistor 22 at the time of resetting operation (foregoing word line electric potential Vg_reset) does not contribute to relative strength of stress application at the time of performing resetting operation. Accordingly, for the relative strength of stress application at the time of performing resetting operation, Expression 3 and Expression 4 described below are established.

$$Vg\_reset \text{ (at the time of applying strong resetting stress)} = Vg\_reset \text{ (at the time of applying weak resetting stress)} \quad 3$$

$$Vreset \text{ (at the time of applying strong resetting stress)} > Vreset \text{ (at the time of applying weak resetting stress)} \quad 4$$

Figure 7:
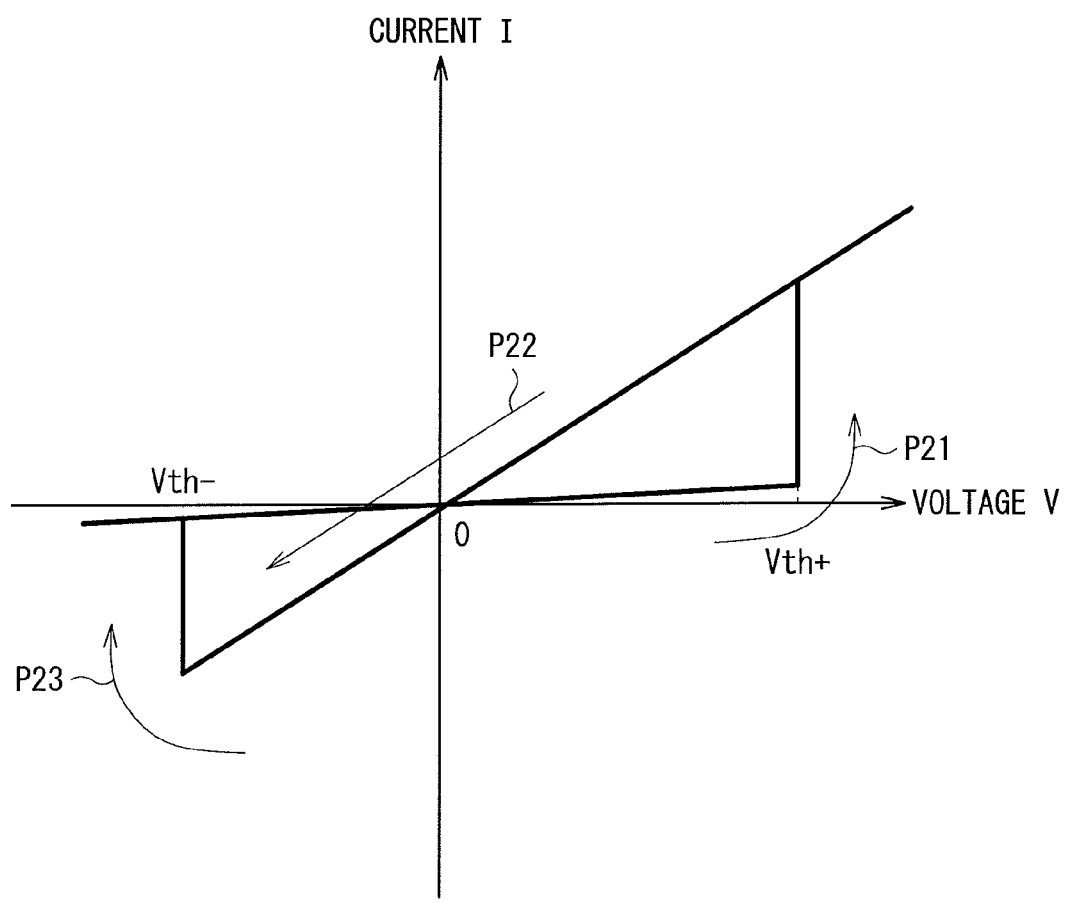
FIG. 7 is a characteristics diagram illustrating an example of general current-voltage characteristics in the memory element.

By repeating the foregoing steps (the setting operation and the resetting operation) as described above, in the memory element 21, writing information and erasing the written information are able to be performed repeatedly. For example, FIG. 7 illustrates such a state more specifically. In FIG. 7, the horizontal axis indicates magnitude and polarity of voltage V applied to the memory element 21, and the vertical axis indicates current I flowing in the memory element 21 at that time. First, in the case where the memory element 21 is in high resistance state (initial state), even if a voltage is applied to the memory element 21, the current I scarcely flows. Next, as indicated by an arrow P21 in the figure, when a positive voltage exceeding a given threshold Vth+ is applied to the memory element 21, state of the memory element 21 is shifted to state in which a current drastically flows (low resistance state). Subsequently, as indicated by an arrow P22 in the figure, even if the applied voltage V is returned to 0 V, the low resistance state is retained. After that, as indicated by an arrow P23 in the figure, when a negative voltage exceeding a given threshold voltage Vth− is applied to the memory element 21, state of the memory element 21 is shifted to state in which a current does not flow drastically (high resistance state). After that, even after the applied voltage V is returned to 0 V, such high resistance state is retained. Accordingly, it is found that by applying voltages with different polarities to the memory element 21, the resistance value (resistance state) is changed reversibly.

Further, for example, in the case where the state in which the resistance value is high (high resistance state) corresponds to information "0," and the state in which the resistance value is low (low resistance state) corresponds to information "1," it is able to state that information "0" is changeable to information "1" in the course of recording information by applying a positive voltage, and information "1" is changeable to information "0" in the course of erasing information by applying a negative voltage.

It is a definition issue whether writing operation/erasing operation for the memory element 21 corresponds to decreasing resistance (change from high resistance state to low resistance state) or increasing resistance (change from low resistance state to high resistance state). In this specification, low resistance state is defined as writing state, and high resistance state is defined as erasing state.

(2. Details of Setting Operation and Resetting Operation)

Next, a description will be given in detail of setting operation and resetting operation in the memory unit 1 as one of the features of the present disclosure by comparing to a comparative example.

(2-1. Comparative Example)

First, a description will be given of setting operation and resetting operation according to the comparative example with reference to FIG. 8A to FIG. 11D. FIGS. 8A to 8C illustrate setting operation according to the comparative example with the use of timing waveform charts. FIGS. 9A to 9C illustrate resetting operation according to the comparative example with the use of timing waveform charts. In the figures, FIGS. 8A and 9A each illustrate a timing waveform of a voltage applied to the bit line BL1, FIGS. 8B and 9B each illustrate a timing waveform of a voltage applied to the bit line BL2, and FIGS. 8C and 9C each illustrate a timing waveform of a voltage applied to the word line WL.

The setting operation and the resetting operation according to the comparative example are performed as described in the foregoing general setting operation and the foregoing general resetting operation. Specifically, at the time of the setting operation illustrated in FIGS. 8A to 8C, 0 V is applied to the bit line BL1, the setting voltage Vset (fixed value) is applied to the bit line BL2, and the given word line electric potential Vg_set (in this case, Vg_set1) is applied to the word line WL. At the time of the resetting operation illustrated in FIGS. 9A to 9C, the given resetting voltage (in this case, Vreset1) is applied to the bit line BL1, 0 V is applied to the bit line BL2, and the given word line electric potential Vg_reset (fixed value) is applied to the word line WL. In this case, state that respective stress application steps are performed plural times until the memory element 21 has a desired resistance value while verification operation is performed is schematically illustrated.

In the foregoing memory element 21, it is important to upgrade retention characteristics of data (information) in order to improve long-term reliability. Examples of the retention characteristics of data include the retention characteristics at the time of the foregoing setting operation and the foregoing resetting operation. In this case, if the foregoing strong setting stress application and the foregoing strong resetting stress application are performed at the time of setting operation and at the time of the resetting operation within the allowable range of a device (that is, Vg_set1 and Vreset1 described above are respectively increased as much as possible), data retention characteristics at the time of the setting operation and at the time of the resetting operation may be upgraded, and long-term reliability may be improved.

Figure 10:
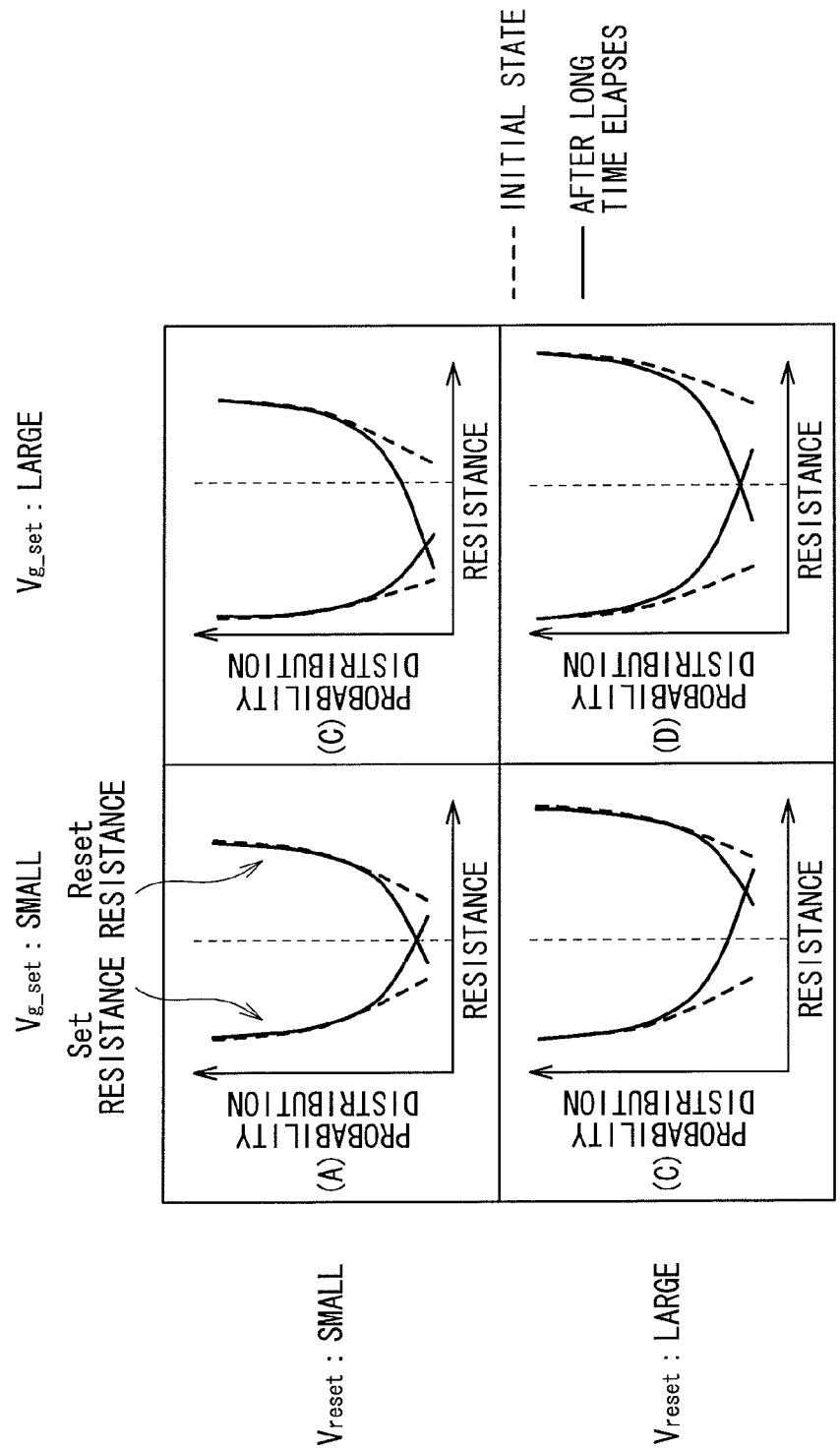
FIG. 10 is a characteristics diagram for explaining relation between setting operation and resetting operation and long-term reliability according to the comparative example.
Figure 11:
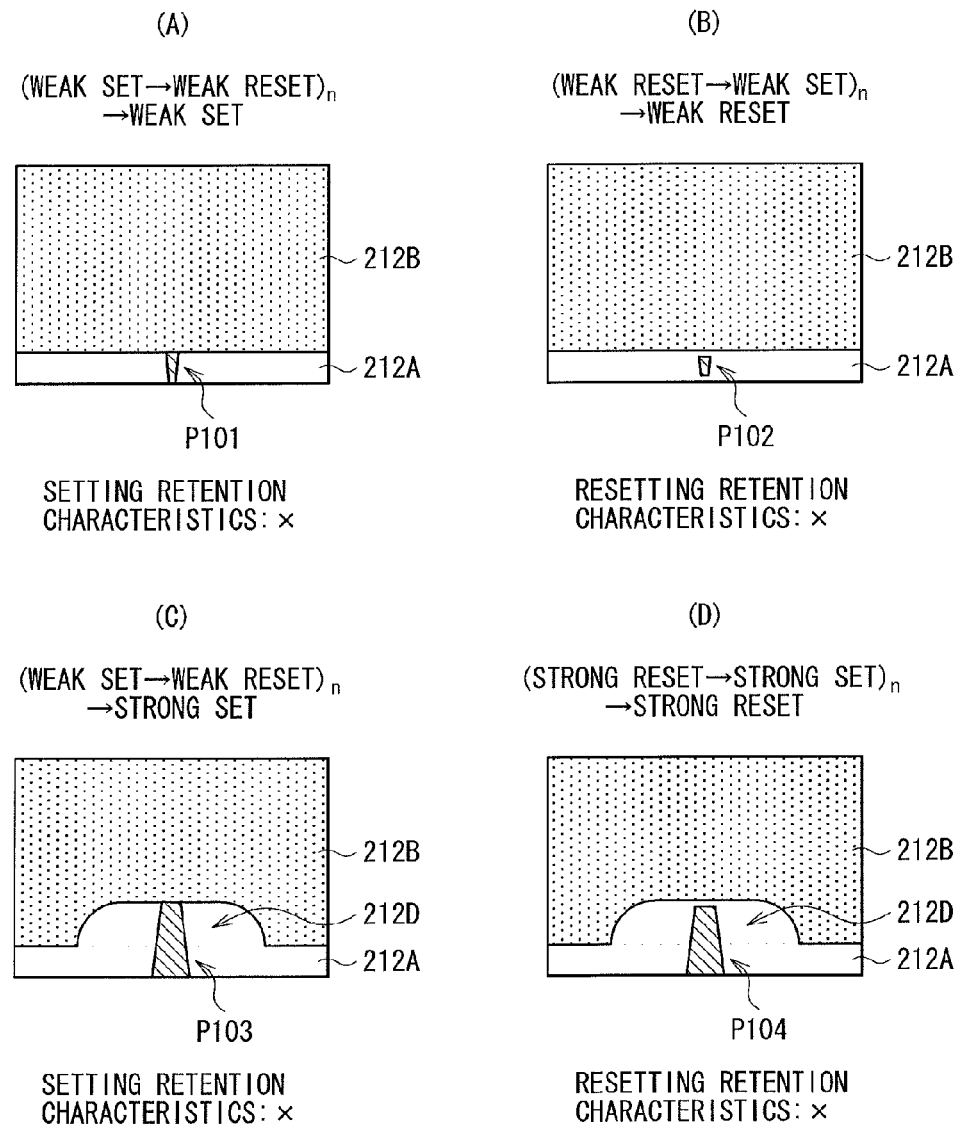
FIGS. 11A to 11D are schematic cross sectional views for explaining function in the memory element in setting operation and resetting operation according to the comparative example.

In this case, for example, as schematically illustrated in (D) of FIG. 10, in the initial state, separation width between setting resistance (Set resistance) and resetting resistance (Reset resistance) is large, and data retention characteristics both at the time of the setting operation and at the time of the resetting operation are high. However, after long time elapses, the separation width is decreased (in this case, the separation width disappears). In other words, in the case where strong setting stress application and strong resetting stress application are performed, the data retention characteristics both at the time of the setting operation and at the time of the resetting operation are degraded with time, and long-term reliability of the memory element 21 is lowered.

Meanwhile, by contrast, in the case where weak setting stress application and weak resetting stress application are performed at the time of the setting operation and at the time of the resetting operation (Vg_set1 and Vreset1 are respectively decreased as much as possible), since separation width between setting resistance and resetting resistance is small at the time of initial state, long-term reliability of the memory element 21 is low as well (see (A) of FIG. 10). Further, in the case where relatively strong stress application is performed at the time of performing one operation out of the setting operation and the resetting operation and relatively weak stress application is performed at the time of performing the other operation out of the setting operation and the resetting operation, data retention characteristics of one operation out of the setting operation and the resetting operation are upgraded, while data retention characteristics of the other operation out of the setting operation and the resetting operation are lowered. In other words, in the case where the strong setting stress application and the weak resetting stress application are performed (Vg_set1 is increased and Vreset1 is decreased), data retention characteristics of the setting operation are upgraded, while data retention characteristics of the resetting operation are lowered (see (B) of FIG. 10). Further, in the case where weak setting stress application and strong resetting stress application are performed (Vg_set1 is decreased and Vreset1 is increased), data retention characteristics of the resetting operation are upgraded, while data retention characteristics of the setting operation are lowered (see (C) of FIG. 10). In (A) to (D) of FIG. 10, the initial state means a state immediately after a cycle, and the state after long time elapses means a state after heat accelerated test. The same is applied to the following description.

As described above, in the method of setting operation and resetting operation according to the comparative example, it is difficult to appropriately adjust strength balance between stress applications in performing the setting operation and the resetting operation, and it is also difficult to upgrade data retention characteristics. In result, in the memory element 21 according to the comparative example, long-term reliability is lowered. Such a fact may result from the following reasons. That is, data retention characteristics at the time of the setting operation depend on strength level of stress application for the resetting operation for the memory element 21 (in the past), while, by contrast, data retention characteristics at the time of the resetting operation depend on strength level of stress application for the setting operation for the memory element 21 (in the past). Specifically, in a memory element for which strong resetting stress application has been performed in the past, data retention characteristics at the time of setting operation are lowered. By contrast, in a memory element for which strong setting stress application has been performed in the past, data retention characteristics at the time of the resetting operation are lowered. In other words, stress application advantageous to setting operation works against retention characteristics at the time of resetting operation, while stress application advantageous to resetting operation works against data retention characteristics at the time of setting operation, which means trade-off.

A description will be hereinafter given of the foregoing explanation with reference to the schematic views illustrated in FIGS. 11A to 11D. In the case where weak setting stress application is performed after weak resetting stress application as illustrated in FIG. 11A, for example, a filament formed by such weak setting stress application (see a referential symbol P101) becomes small and is easily cut, and data retention characteristics (setting retention characteristics) at the time of setting operation are lowered. Meanwhile, in the case where strong setting stress application is performed after strong resetting stress application as illustrated in FIG. 11C, for example, a filament formed by such strong setting stress application (see a referential symbol P103) becomes long and is easily cut, and setting retention characteristics are lowered as well. Further, in the case where weak resetting stress application is performed after weak setting stress application as illustrated in FIG. 11B, for example, a depleted layer is less likely to be formed around a filament (see a referential symbol P102), high resistance is insufficiently realized, and data retention characteristics (resetting retention characteristics) at the time of resetting operation are lowered. Meanwhile, in the case where strong resetting stress application is performed after strong setting stress application as illustrated in FIG. 11D, for example, though a depleted layer 212D is formed around a filament (see a referential symbol P104), high resistance is insufficiently realized since the filament itself is easily left, and resetting retention characteristics are lowered as well. "STRONG SET," "WEAK SET," "STRONG RESET," and "WEAK RESET" illustrated in FIGS. 11A to 11D respectively mean strong setting stress application step, weak setting stress application step, strong resetting stress application step, and weak resetting stress application step, and the same is applied to the following description. Further, "n" in FIGS. 11A to 11D means that stress application step in parentheses is repeated n times (n: an integer number equal to or greater than 1), and the same is applied to the following description.

(2-2. Example)

Figure 12:
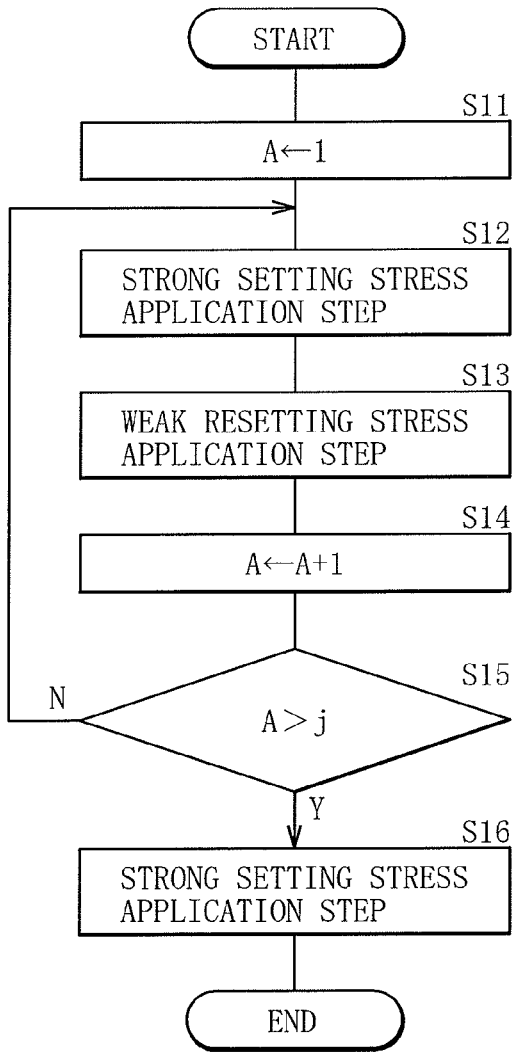
FIG. 12 is a flowchart illustrating an example of setting operation according to the embodiment.
Figure 13:
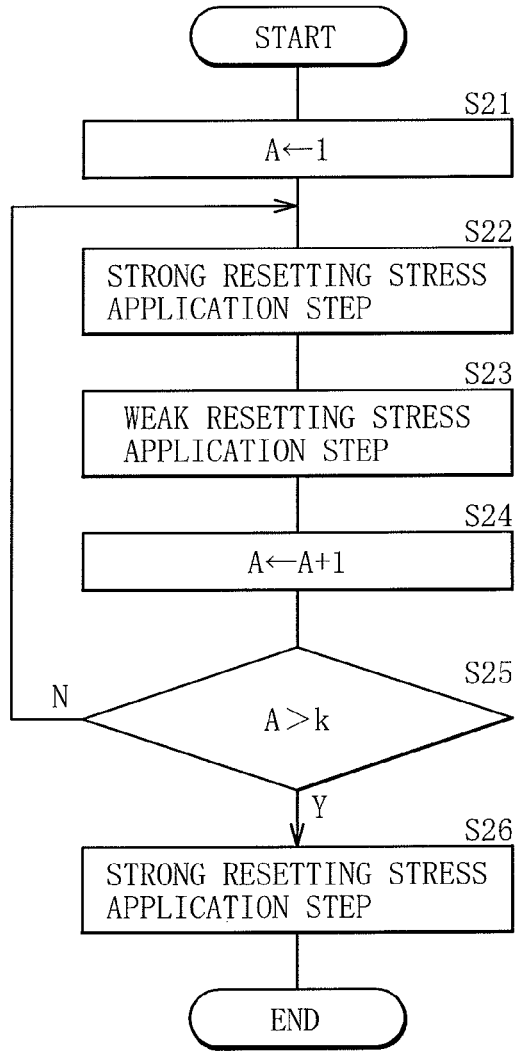
FIG. 13 is a flowchart illustrating an example of resetting operation according to the embodiment.
Figure 14:
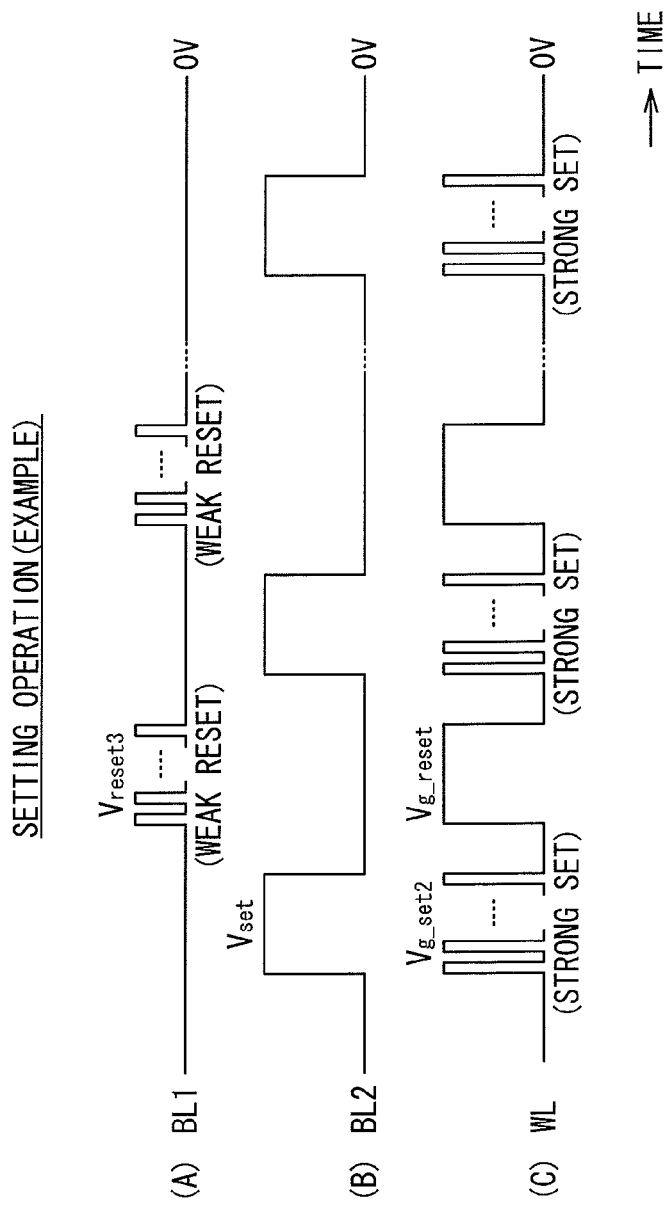
FIGS. 14A to 14C are timing waveform charts illustrating an example of setting operation according to the embodiment.
Figure 15:
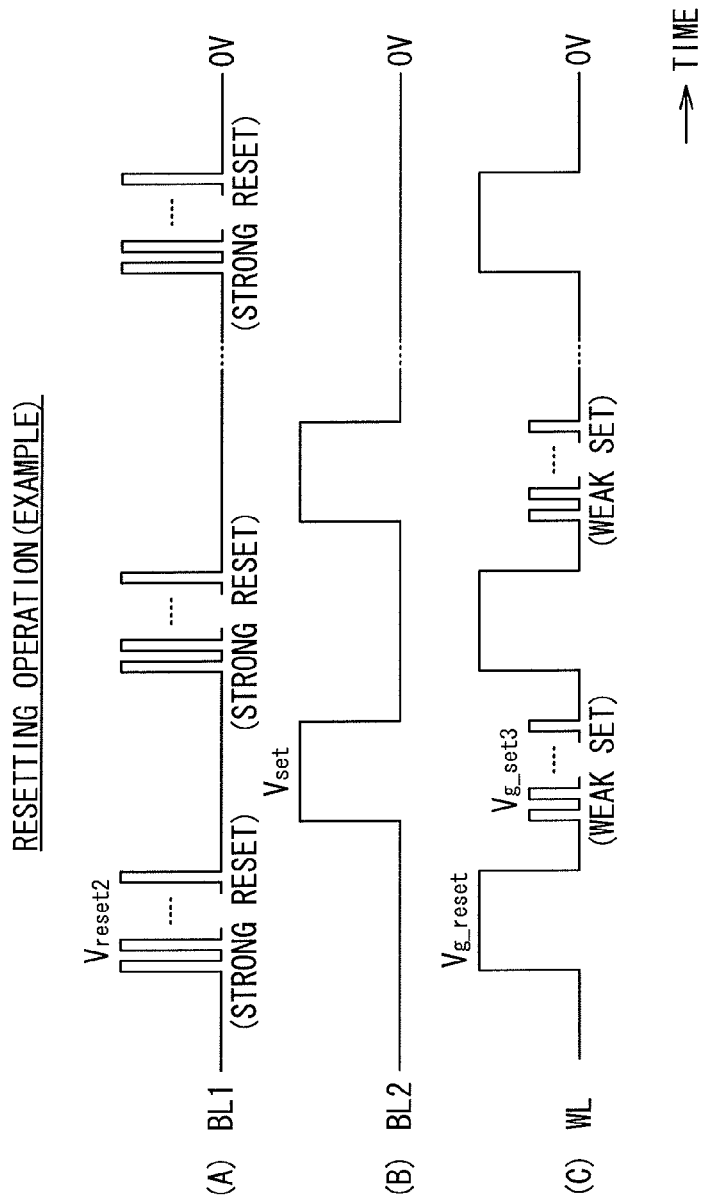
FIGS. 15A to 15C are timing waveform charts illustrating an example of resetting operation according to the embodiment.
Figure 16:
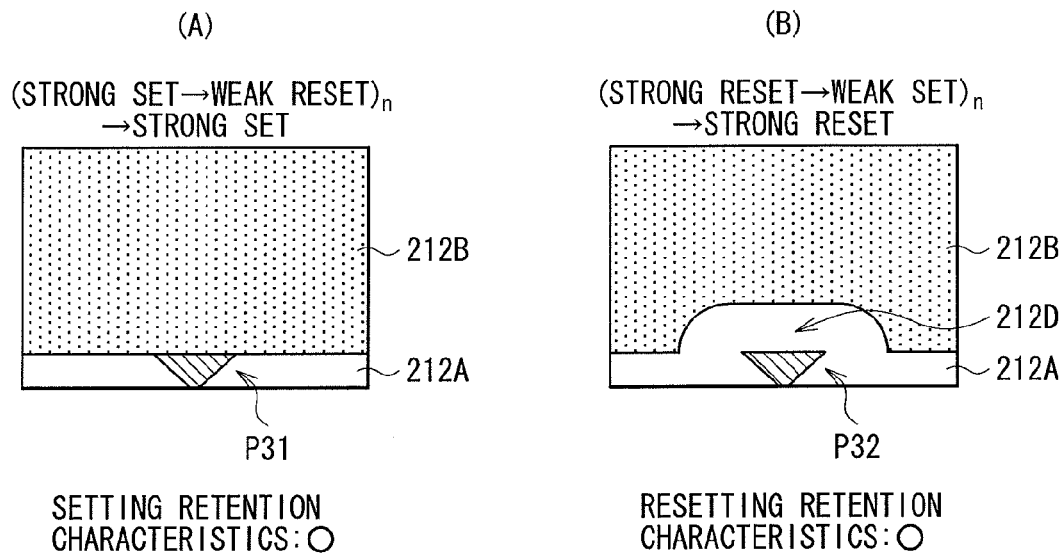
FIGS. 16A and 16B are schematic cross sectional views for explaining function in the memory element in the setting operation and the resetting operation according to the embodiment.

Meanwhile, in the memory unit 1 of this embodiment, the disadvantage in the foregoing comparative example (disadvantage that long-term reliability is lowered) is resolved by, for example, a method of the example illustrated in FIG. 12 to FIG. 17. FIG. 12 illustrates setting operation according to the example of this embodiment with the use of a flowchart. FIG. 13 illustrates resetting operation according to the example of this embodiment with the use of a flowchart. FIGS. 14A to 14C illustrate setting operation according to the example with the use of a timing waveform chart. FIGS. 15A to 15C illustrate resetting operation according to the example with the use of a timing waveform chart. In FIGS. 14A to 15C, FIGS. 14A and 15A each illustrate a timing waveform of a voltage applied to the bit line BL1, FIGS. 14B and 15B each illustrate a timing waveform of a voltage applied to the bit line BL2, and FIGS. 14C and 15C each illustrate a timing waveform of a voltage applied to the word line WL.

First, in setting operation and resetting operation of this embodiment, the word line drive section 31 and the bit line drive section/sense amplifier 32 (hereinafter referred to as a "drive section") perform stepwise operation as follows. In executing a first operation out of the first operation for changing one resistance state to the other resistance state out of low resistance state and high resistance state in the memory element 21 and a second operation for changing the other resistance state to one resistance state, the drive section repeatedly performs, at least one time, a step in which strong stress application step of the first operation is performed and subsequently weak stress application step of the second operation is performed, and subsequently performs the strong stress application step of the first operation. As described below in detail, the first operation corresponds to one operation out of setting operation and resetting operation, and the second operation corresponds to the other operation out of these two operations. Therefore, the foregoing strong stress application step corresponds to the foregoing strong setting stress application step or the foregoing strong resetting stress application step, and the foregoing weak stress application step corresponds to the foregoing weak setting stress application step or the foregoing weak resetting stress application step.

(Setting Operation)

Specifically, at the time of the setting operation of this embodiment, since the foregoing first operation is the setting operation and the second operation is the resetting operation, the drive section performs stepwise operation as follows. In executing the foregoing setting operation, the drive section executes strong setting stress application step after repeatedly performing, at least one time, a step in which strong setting stress application step is performed and subsequently weak resetting stress application step is performed.

More specifically, the drive section performs stepwise operation as illustrated in FIG. 12 and FIGS. 14A to 14C, for example. First, given variable number (parameter) A is set to 1 (step S11 of FIG. 12). Next, strong setting stress application step is performed (step S12), weak resetting stress application step is performed (step S13), the value of the variable number A is increased by 1 (step S14), and whether the value of the variable number A is larger than a given threshold j (repeat count of the foregoing step: integer number equal to or greater than 1) or not is determined (step S15). If the value of the variable number A is equal to or smaller than the threshold j (step S15: N), the procedure is returned back to step S12, and operations of steps S12 to S14 are repeated. Meanwhile, if the value of the variable number A is larger than the threshold j (step S15: Y), strong setting stress application step is subsequently performed (step S16), and setting operation (stepwise operation) of this embodiment illustrated in FIG. 12 is finished.

In the setting operation of this embodiment in which such stepwise operation is performed, for example, as illustrated in FIG. 16A, a formation region of the ion depleted layer becomes small (see a referential symbol P31). Therefore, compared to setting operation of the foregoing comparative example, data retention characteristics at the time of the setting operation are improved.

(Resetting Operation)

Meanwhile, at the time of the resetting operation of this embodiment, since the foregoing first operation is resetting operation and the second operation is setting operation, the drive section performs stepwise operation as follows. In executing the foregoing resetting operation, the drive section executes strong resetting stress application step after repeatedly performing, at least one time, a step in which strong resetting stress application step is performed and subsequently weak setting stress application step is performed.

More specifically, the drive section performs stepwise operation as illustrated in FIG. 13 and FIGS. 15A to 15C, for example. First, given variable number A is set to 1 (step S21 of FIG. 13). Next, strong resetting stress application step is performed (step S22), weak setting stress application step is performed (step S23), the value of the variable number A is increased by 1 (step S24), and whether the value of the variable number A is larger than a given threshold k (repeat count of the foregoing step: integer number equal to or greater than 1) or not is determined (step S25). If the value of the variable number A is equal to or smaller than the threshold k (step S25: N), the procedure is returned back to step S22, and operations of steps S22 to S24 are repeated. Meanwhile, if the value of the variable number A is larger than the threshold k (step S25: Y), strong resetting stress application step is subsequently performed (step S26), and resetting operation (stepwise operation) of this embodiment illustrated in FIG. 13 is finished.

In the resetting operation of this embodiment in which such stepwise operation is performed, for example, as illustrated in FIG. 16B, a region where the filament remains in the depleted layer 212D becomes small (see a referential symbol P32). Therefore, compared to resetting operation of the foregoing comparative example, data retention characteristics at the time of the resetting operation are improved.

In this case, where the word line electric potential at the time of the strong setting stress application step is Vg_set2, the word line electric potential at the time of the weak setting stress application step is Vg_set3, the resetting voltage at the time of the strong resetting stress application step is Vreset2, and the resetting voltage at the time of the weak resetting stress application step is Vreset3 as illustrated in FIG. 14A to FIG. 15C, Expressions (Expression 5 and Expression 6) described below are established.

$$Vg\_set3 < Vg\_set2 \qquad 5$$

$$Vreset3 < Vreset2 \qquad 6$$

Figure 17:
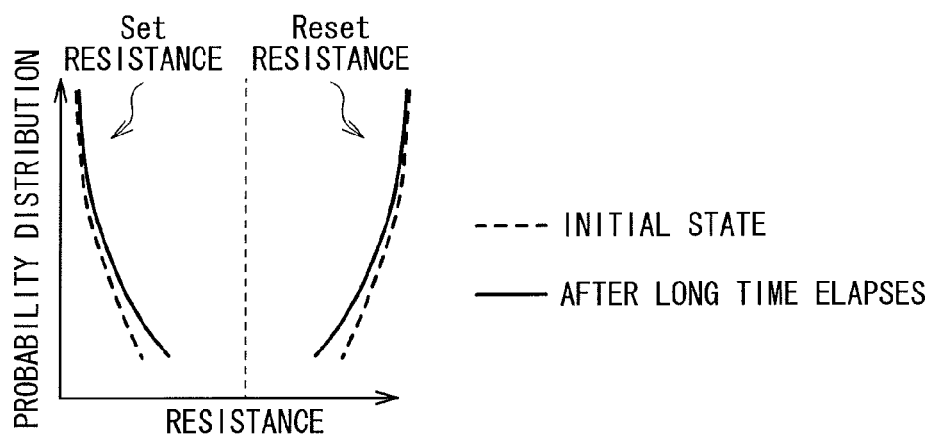
FIG. 17 is a characteristic diagram for explaining relation between the setting operation and the resetting operation and long-term reliability according to the embodiment.

As described above, in the setting operation and the resetting operation of this embodiment, after the relatively weak second operation (resetting operation or setting operation) advantageous to performing the target first operation (setting operation or resetting operation) is performed, the relatively strong first operation is performed. Thereby, as entire stepwise operation, the target first operation is executed. Accordingly, operation strength balance between the first operation and the second operation is appropriately adjusted. In result, data retention characteristics at the time of the target first operation are upgraded. In other words, for example, as illustrated in FIG. 17, differently from the foregoing comparative example, separation width between setting resistance and resetting resistance is large even after long time elapses, and data retention characteristics both in setting operation and in resetting operation are upgraded Examples of existing technologies include a method of respectively increasing values of the word line electric potential Vg_set and the resetting voltage Vreset at the time of setting operation in a stepwise fashion by using, for example, a pulse height value of each application pulse in performing verification operation for the memory element 21. In using such a method in this embodiment, the values of the word line electric potential Vg_set and the resetting voltage Vreset at the time of setting operation may be respectively increased in a stepwise fashion while the relations of the foregoing Expression 5 and Expression 6 are satisfied.

As described above, in this embodiment, in executing the foregoing first operation (setting operation or resetting operation), the drive section performs stepwise operation, in which strong stress application step of the first operation is performed after repeatedly performing, at least one time, a step in which strong stress application step of the first operation is performed and subsequently weak stress application step of the second operation is performed. Therefore, data retention characteristics at the time of the target first operation are able to be upgraded, and long-term reliability in the memory element 21 is able to be improved.

<Modifications>

Subsequently, a description will be given of modifications (modifications 1 to 3) of the foregoing embodiment. For the same elements as those in the foregoing embodiment, the same referential symbols are affixed thereto, and descriptions thereof will be omitted as appropriate.

[Modification 1]

Figure 18:
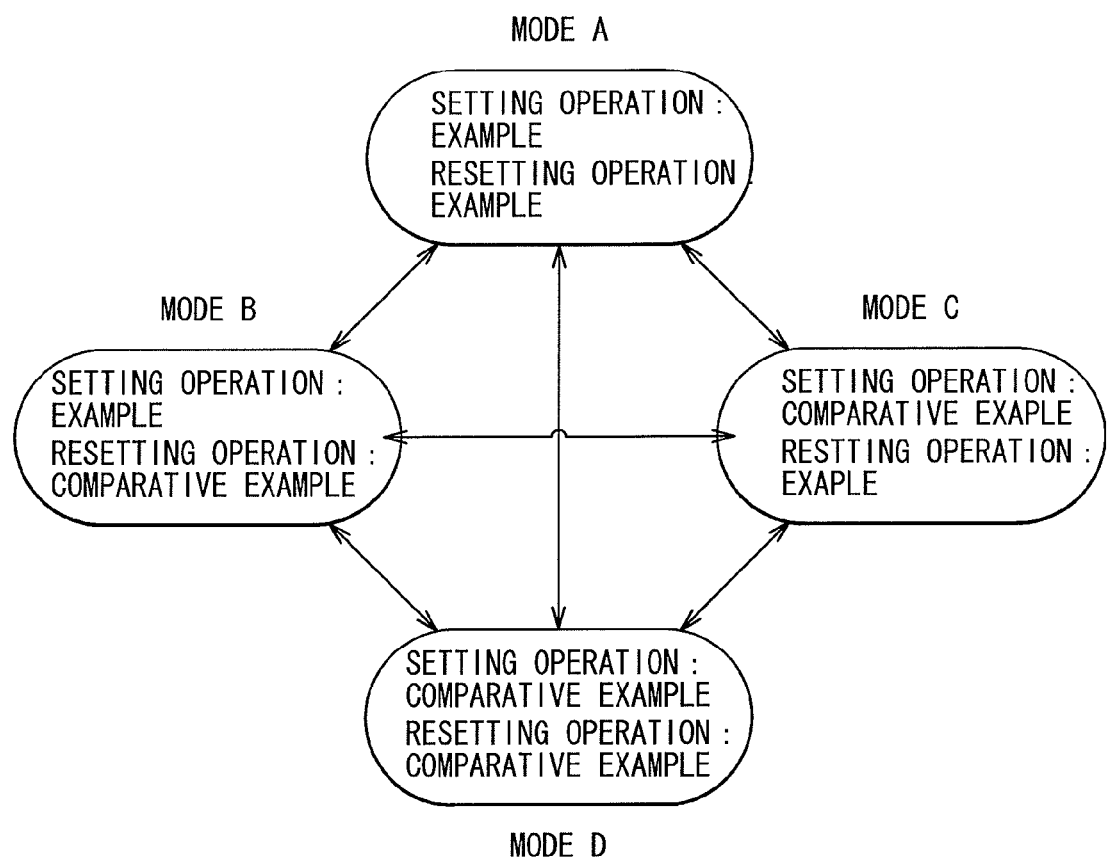
FIG. 18 is a mode transition diagram for explaining setting operation and resetting operation according to Modification 1.

FIG. 18 illustrates setting operation and resetting operation according to Modification 1 with the use of a mode transition diagram. Specifically, FIG. 18 illustrates state transition between four modes A to D (operation modes).

Mode A is an operation mode for performing the stepwise operation (operations illustrated in FIG. 12 to FIG. 15C) explained in the foregoing embodiment (example) both in executing setting operation and in executing resetting operation. Meanwhile, mode D is an operation mode for performing existing general operation (operations illustrated in FIG. 8A to FIG. 9C) explained in the foregoing comparative example both in executing setting operation and in executing resetting operation. Further, Mode B is an operation mode for performing the stepwise operation explained in the foregoing example in executing setting operation and for performing the existing general operation explained in the foregoing comparative example in executing resetting operation. Mode C is, by contrast, an operation mode for performing the stepwise operation explained in the foregoing example in executing resetting operation and for performing the existing general operation explained in the foregoing comparative example in executing setting operation.

In this modification, for example, the foregoing four modes A to D are switchable to one another. However, in some relation between partial modes out of the foregoing modes A to D, such switching is not necessarily made. Such switching between modes may be made according to user's operation (may be made manually), or may be made by automatic control in the memory unit 1. For example, at the time of normal usage, setting operation and resetting operation are performed by using Mode D (existing method). Meanwhile, in the case where data should be retained for a long time, long-term reliability is secured by performing setting operation and resetting operation by using Mode A. Otherwise, data is temporarily saved (stored) by using Mode D, and data is restored by using Mode A automatically when access to the memory element 21 does not exist.

As described above, in this modification, methods of setting operation and resetting operation are able to be switched freely according to usage state and necessity, and user-friendliness is able to be improved.

Further, in the stepwise operation described in the foregoing embodiment, operation time (drive time) tends to be relatively longer than that in the existing method. Therefore, by executing such switching of operation modes as appropriate, operation time is able to be kept at minimum while long-term reliability is secured. In the stepwise operation, long-term reliability is able to be more improved by increasing repeat count of the foregoing steps, while operation time is able to be kept short by decreasing the repeat count.
[Modification 2]

Figure 19:
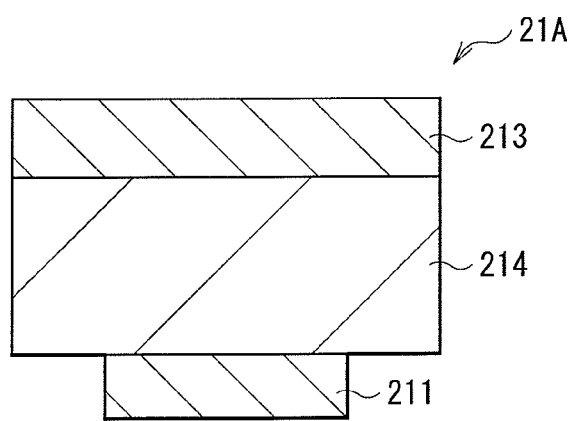
FIG. 19 is a cross sectional view illustrating a configuration example of a memory element according to Modification 2.

FIG. 19 illustrates a cross sectional structure of a memory element (memory element 21A) according to Modification 2. The memory element 21A of this modification is composed of a PCM (Phase Change Memory).

The memory element 21A has a memory layer 214 made of GeSbTe alloy such as $Ge_2Sb_2Te_5$ between the lower electrode 211 and the upper electrode 213. In the memory layer 214, phase change from/to crystalline state to/from noncrystalline state (amorphous state) is generated by application of a current. In association with the phase change, a resistance value (resistance state) is reversibly changed.

In the memory element 21A of this modification, in the case where a positive voltage or a negative voltage is applied between the lower electrode 211 and the upper electrode 213, the memory layer 214 is changed from high resistance amorphous state to low resistance crystalline state (or from low resistance crystalline state to high resistance amorphous state). By repeating such a process, in the memory element 21A, writing information and erasing written information are able to be performed repeatedly.
[Modification 3]

Figure 20:
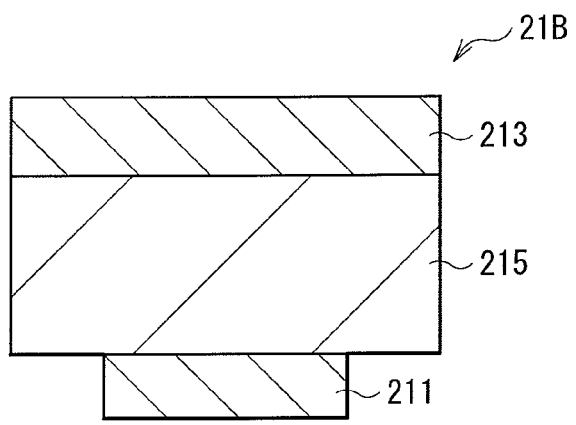
FIG. 20 is a cross sectional view illustrating a configuration example of a memory element according to Modification 3.

FIG. 20 illustrates a cross sectional structure of a memory element (memory element 21B) according to Modification 3. The memory element 21B of this modification is composed of an ReRAM (Resistive Random Access Memory).

The memory element 21B has a memory layer 215 made of an oxide such as NiO, $TiO_2$, and $PrCaMnO_3$ between the lower electrode 211 and the upper electrode 213. A resistance value (resistance state) is reversibly changed by application of a voltage to the oxide.

In the memory element 21B of this modification, in the case where a positive voltage or a negative voltage is applied between the lower electrode 211 and the upper electrode 213, resistance state of the memory layer 215 is changed from high resistance state to low resistance state (or from low resistance state to high resistance state). By repeating such a process, in the memory element 21B, writing information and erasing written information are able to be performed repeatedly.
[Other Modifications]

The present technology has been described with reference to the embodiment and the modifications. However, the present technology is not limited to the foregoing embodiment and the like, and various modifications may be made.

For example, materials and the like of each layer described in the foregoing embodiment and the like are not limited, and other materials may be used. Further, in the foregoing embodiment and the like, the configurations of the memory elements 21, 21A, and 21B and the like are described with specific examples. However, all layers are not necessarily provided, and other layer may be further included.

A memory element applied to the present disclosure is not limited to the memory elements 21, 21A, and 21B described in the foregoing embodiment and the like. In other words, a memory element having other configuration may be used as long as resistance state of such a memory element is reversibly changed according to polarity of an applied voltage.

The present disclosure contains subject matter related to that disclosed in Japanese Priority Patent Application JP 2011-24575 filed in the Japanese Patent Office on Feb. 8, 2011, the entire contents of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. A memory unit comprising:
a plurality of memory elements whose resistance state is reversibly changed according to a polarity of an applied voltage; and
a drive section configured to selectively change a resistance state of a target memory element out of the plurality of memory elements from a low resistance state to a high resistance state and from the high resistance state to the low resistance state,
wherein,
the drive section is configured to execute (a) a setting operation for changing the resistance state of the target memory element from the high resistance state to the low resistance state, and (b) a resetting operation for changing the resistance state of the target memory element from the low resistance state to the high resistance state, and the drive section has an operation mode in which
(a) in executing the setting operation, the drive section (i) performs a first stepwise operation in which the drive section repeatedly performs, at least one time, (1) a strong setting stress application step in which a relatively strong stress for performing the setting operation is applied to the target memory element, followed by (2) a weak resetting stress application step in which a relatively weak stress for performing the resetting operation is applied to the target memory element, and (ii) subsequently performs the strong setting stress application step, and
(b) in executing the resetting operation, the drive section (i) performs a second stepwise operation in which the drive section repeatedly performs, at least one time, (1) a strong resetting stress application step in which a relatively strong stress for performing the resetting operation is applied to the target memory element, followed by (2) a weak setting stress application step in which a relatively weak stress for performing the setting operation is applied to the target memory element, and (ii) subsequently performs the strong resetting stress application step.

2. The memory unit according to claim 1, wherein:
the drive section has another operation mode in which the stepwise operation is not performed either in executing the setting operation or in executing the resetting operation, and
the drive section is switchable between the two modes.

3. The memory unit according to claim 1, wherein:
each memory element has a first electrode, a memory layer, and a second electrode in this order, and
in the memory layer, a resistance state thereof is reversibly changed according to a polarity of a voltage applied between the first electrode and the second electrode.

4. The memory unit according to claim 3, wherein the memory layer has a resistance change layer provided on the first electrode side and an ion source layer provided on the second electrode side.

5. The memory unit according to claim 4, wherein:
to perform the setting operation, a negative electric potential is applied to the first electrode and a positive electric potential is applied to the second electrode so that ions in the ion source layer are moved to the first electrode side and a resistance of the resistance change layer is decreased, and
to perform the resetting operation, a positive electric potential is applied to the first electrode and a negative electric potential is applied to the second electrode so that ions in the ion source layer are moved to the second electrode side and the resistance of the resistance change layer is increased.

6. A method of operating a memory unit, the memory unit including a plurality of memory elements whose resistance state is reversibly changed according to a polarity of an applied voltage, the method comprising:
executing a setting operation for changing a resistance state of a target memory element out of the plurality of memory elements from a high resistance state to a low resistance state; and
executing a resetting operation for changing the resistance state of the target memory element from the low resistance state to the high resistance state,
wherein,
executing the setting operation includes (a) repeatedly performing, at least one time, a first stepwise operation of (i) performing a strong setting stress application step in which a relatively strong stress for performing the setting operation is applied to the target memory element, followed by performing (ii) a weak resetting stress application step in which a relatively weak stress for performing the resetting operation is applied to the target memory element, and (b) subsequently performing the strong setting stress application step, and
executing the resetting operation includes (a) repeatedly performing, at least one time, a second stepwise operation of (i) performing a strong resetting stress application step in which a relatively strong stress for performing the resetting operation is applied to the target memory element, followed by performing (ii) a weak setting stress application step in which a relatively weak stress for performing the setting operation is applied to the target memory element, and (b) subsequently performing the strong resetting stress application step.

* * * * *